United States Patent
Lin et al.

(10) Patent No.: US 11,545,573 B2
(45) Date of Patent: Jan. 3, 2023

(54) HYBRID NANOSTRUCTURE AND FIN STRUCTURE DEVICE

(71) Applicant: Taiwan Semiconductor Manufacturing Co., Ltd., Hsin-Chu (TW)

(72) Inventors: Ta-Chun Lin, Hsinchu (TW); Kuo-Hua Pan, Hsinchu (TW); Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 78 days.

(21) Appl. No.: 16/566,037

(22) Filed: Sep. 10, 2019

(65) Prior Publication Data
US 2021/0074841 A1    Mar. 11, 2021

(51) Int. Cl.
| | |
|---|---|
| H01L 29/78 | (2006.01) |
| H01L 21/02 | (2006.01) |
| H01L 29/66 | (2006.01) |
| H01L 21/8234 | (2006.01) |
| H01L 21/768 | (2006.01) |

(52) U.S. Cl.
CPC ...... *H01L 29/785* (2013.01); *H01L 21/02532* (2013.01); *H01L 21/02603* (2013.01); *H01L 21/76816* (2013.01); *H01L 21/76877* (2013.01); *H01L 21/823431* (2013.01); *H01L 29/66795* (2013.01)

(58) Field of Classification Search
CPC ....... H01L 21/823431; H01L 21/02532; H01L 29/785; H01L 29/66795; H01L 27/0922; H01L 27/0924
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2013/0285116 A1 | 10/2013 | Lochtefeld et al. |

(Continued)

*Primary Examiner* — Phat X Cao
(74) *Attorney, Agent, or Firm* — Haynes and Boone, LLP

(57) ABSTRACT

A method includes depositing a semiconductor stack within a first region and a second region on a substrate, the semiconductor stack having alternating layers of a first type of semiconductor material and a second type of semiconductor material. The method further includes removing a portion of the semiconductor stack from the second region to form a trench and with an epitaxial growth process, filling the trench with the second type of semiconductor material. The method further includes patterning the semiconductor stack within the first region to form a nanostructure stack, patterning the second type of semiconductor material within the second region to form a fin structure, and forming a gate structure over both the nanostructure stack and the fin structure.

20 Claims, 8 Drawing Sheets

(56) References Cited

U.S. PATENT DOCUMENTS

| | | | | |
|---|---|---|---|---|
| 2016/0163810 A1* | 6/2016 | Huang | ............... | H01L 29/42356 |
| | | | | 257/329 |
| 2016/0240378 A1* | 8/2016 | Huang | ............... | H01L 21/76205 |
| 2017/0179128 A1* | 6/2017 | Balakrishnan | .... | H01L 29/66545 |
| 2018/0366375 A1* | 12/2018 | Chen | ..................... | H01L 27/092 |
| 2020/0006147 A1* | 1/2020 | Ando | .................. | H01L 27/0924 |
| 2020/0135937 A1* | 4/2020 | Kong | ................ | H01L 29/42392 |
| 2020/0312658 A1* | 10/2020 | Miura | ................. | H01L 21/3065 |
| 2020/0388681 A1* | 12/2020 | Yamashita | ........ | H01L 29/66439 |

\* cited by examiner

HYBRID NANOSTRUCTURE AND FIN STRUCTURE DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
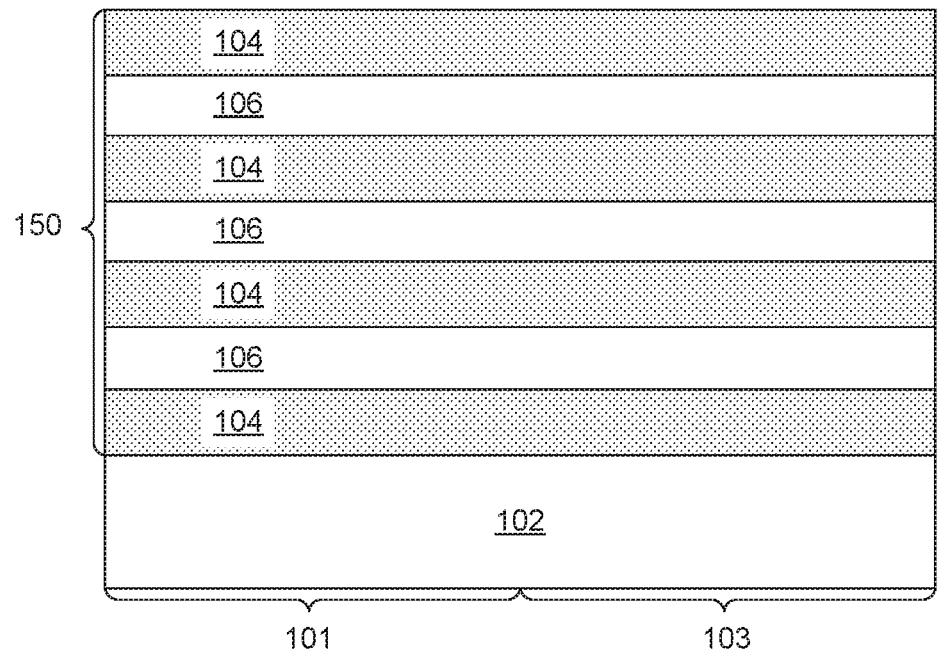
FIGS. 1A, 1B, 1C, 1D, 1E, 1F, 1G, 1H, 1I, and 1J, are diagrams showing a process for forming a hybrid nanostructure and fin structure device, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and the fabrication thereof, and more particularly to methods of fabricating field-effect transistors (FETs), such as fin-like FETs (FinFETs), gate-all-around FETs (GAA FETs), and/or other FETs.

In some example embodiments, to form a GAA device, a semiconductor fin may include a total of three to ten alternating layers of semiconductor materials; of course, the present disclosure is not limited to such configuration. In one example of principles described herein, the first semiconductor material includes Si, while the second semiconductor material includes SiGe. Either of the semiconductor materials and (or both) may be doped with a suitable dopant, such as a p-type dopant or an n-type dopant, for forming desired FETs. The semiconductor materials and may each be formed by an epitaxial process, such as, for example, a molecular beam epitaxy (MBE) process, a CVD process, and/or other suitable epitaxial growth processes.

In many examples, alternating layers of the semiconductor materials are configured to provide nanowire or nanosheet devices such as GAA FETs, the details of forming which are provided below. GAA FETs have been introduced in effort to improve gate control by increasing gate-channel coupling, reduce OFF-state current, and reduce short-channel effects. A multi-gate device such as a GAA FET generally includes a gate structure that extends around its channel region (horizontal or vertical), providing access to the channel region on all sides. The GAA FETs are generally compatible with CMOS processes, allowing them to be aggressively scaled down while maintaining gate control and mitigating short-channel effects. Of course, the present disclosure is not limited to forming GAA FETs only and may provide other three-dimensional FETs such as FinFETs.

In a GAA device, a channel stack is formed by depositing alternating layers of material that may be selectively etched. For example, a first type of semiconductor material may be epitaxially grown within a space formed between two active regions. Then, a second type of semiconductor material may be epitaxially grown. The process continues by forming alternating layers of the first and second semiconductor material. Then, a first etching process (e.g., a dry etching process) is used to cut the channel stack and expose each layer of the channel stack. Then, a second etching process (e.g., a wet etching process) can be used to remove the first semiconductor material while leaving the second semiconductor material substantially intact. The remaining second semiconductor material may thus form a stack of nanowires or nanosheets extending between two active regions.

According to principles described herein, device or circuit may include a hybrid structure that includes both a GAA structure as well as a finFET structure. For example, in a single set of processes, an n-type GAA structure may be fabricated adjacent a p-type finFET structure. Specifically, the two different structures may be formed by depositing a semiconductor stack within a first region (e.g., n-type region) and a second region (e.g., p-type) on a substrate. The semiconductor stack has alternating layers of a first type of semiconductor material (e.g., silicon) and a second type of semiconductor material (e.g., silicon germanium). Then, a portion of the semiconductor stack is removed from the second region to form a trench. An epitaxial growth process is then used to fill the trench with the second type of semiconductor material. The semiconductor stack is then patterned to form a nanostructure stack. In the same or a separate patterning process, the second type of semiconductor material within the second region is patterned to form a fin structure. The fin structure may then be temporarily covered while the first type of material is removed from the nanostructure stack. Then, a gate structure is formed over both the nanostructure stack and the fin structure.

FIGS. 1A, 1B, 1C, 1D, 1E, 1F, 1G, 1H, 1I, and 1J, are diagrams showing a process for forming a hybrid nanostructure and fin structure device. FIG. 1A illustrates a semiconductor substrate 102 and a semiconductor stack 150. The semiconductor substrate 102 may be a silicon substrate. The semiconductor substrate may be part of a silicon wafer. Other semiconductor materials are contemplated. The active regions 104 may be a semiconductor that is doped to create the desired properties for source/drain regions of the transistor. The substrate 102 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a silicon layer formed on a silicon oxide layer. In another example, the substrate 102 may include a conductive layer, a semiconductor layer, a dielectric layer, other layers, or combinations thereof.

Substrate 102 is divided into a first region 101 and a second region 103. In one example, the first region 101 is an n-type region. An n-type region is a region in which an n-type semiconductor structure is to be formed. In one example, the second region 103 is a p-type region. A p-type region is one in which a p-type structure is to be formed.

The semiconductor stack 150 includes several semiconductor layers that alternate between a first type layer 106 made of a first type semiconductor material and a second type layer 104 made of a second type semiconductor material. In one example, the first type of semiconductor material is silicon and the second type of semiconductor material is silicon germanium. Other semiconductor materials are contemplated. The first type layers 106 and the second type layers 104 may be formed using a variety of processes, including epitaxial growth processes. Other processes are contemplated.

Figure 1B:
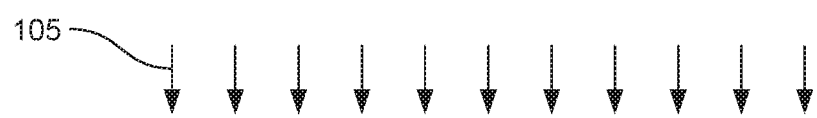
Figure 1B:
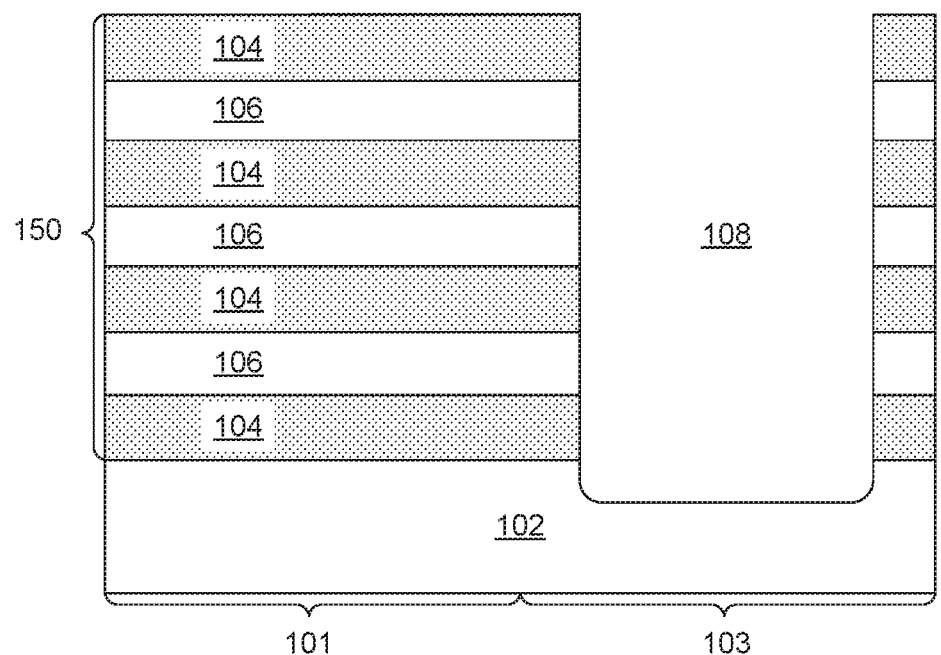

FIG. 1B illustrates a patterning process 105 to remove a portion of the semiconductor stack 150 to form a trench 108. The portion that is removed is within the second region 103. The trench 108 extends all the way through the semiconductor stack 150 and partially into the substrate 102. The process used to form the trench 108 may be, for example, an etching process. In one example, the etching process is a dry etching process. In some examples, photolithographic process is used to form the trench. Specifically, a photoresist material may be deposited onto the semiconductor stack 150. Then, the photoresist may be exposed to a light source through a photomask. The photomask may then be developed so as to expose the region where the trench 108 it is to be formed. The unexposed regions may then be protected from the etching process 105.

Figure 1C:
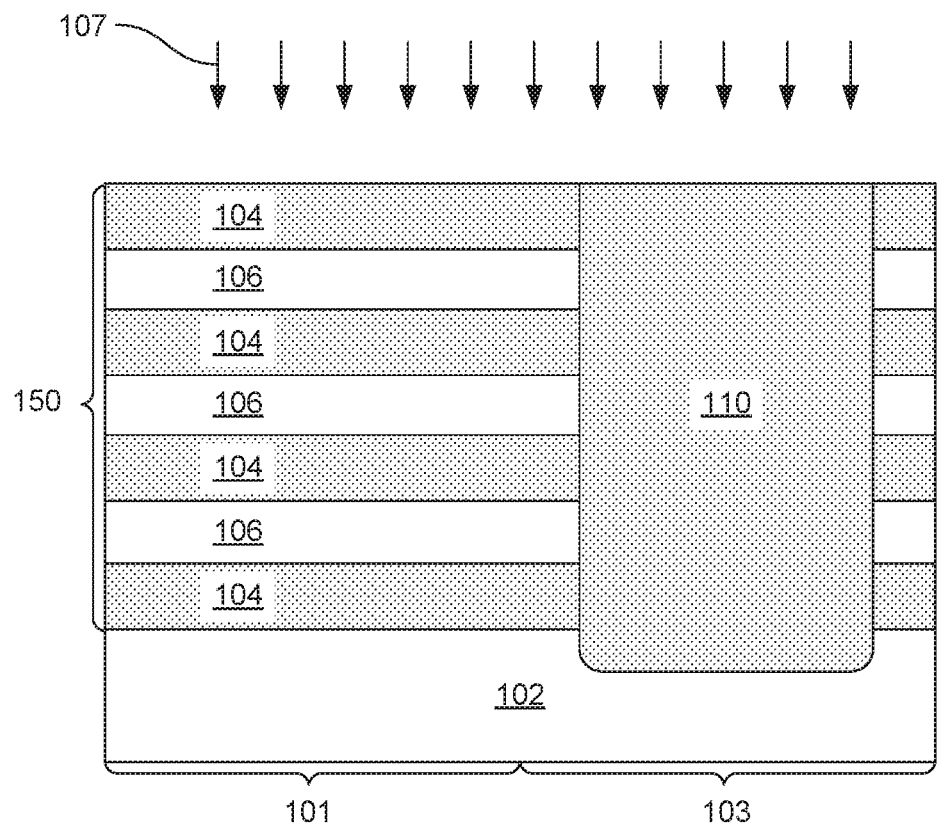

FIG. 1C illustrates an epitaxial growth process 107 to fill the trench 108 with a semiconductor material 110. The semiconductor material 110 may be the same as the semiconductor material used to form the second type layers 104. For example, the semiconductor material 110 may be silicon germanium. In some examples, the semiconductor material 110 may be placed under biaxial stress due to the crystallographic differences between the semiconductor layer 110 and the underlying substrate 102.

Figure 1D:
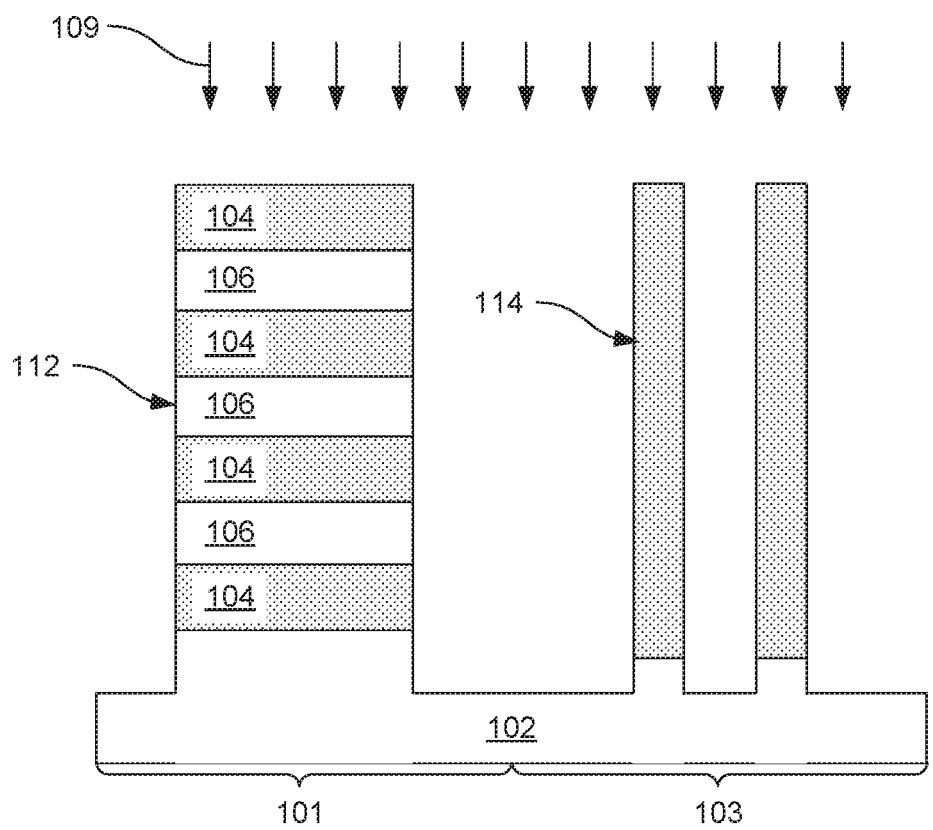

FIG. 1D illustrates a patterning process 109 to pattern the semiconductor stack 150 within the first region 101 and the semiconductor material 110 within the second region. The patterning process 109 may involve one or more etching processes such as dry etching processes. In one example, both regions 101, 103 are patterned in the same photolithographic process. In other words, a photomask used in a photolithographic process is used for both region 101, 103. In some examples, however, separate processes are used to pattern the first and second regions 101, 103. In other words, a first photomask may be used to directly pattern the first region 101 (as well as other similar regions of the substrate). And, a second, different photomask may be used to pattern the second region 103 (as well as other similar regions of the substrate). In some examples, the second region 103 may be patterned using double patterning techniques that involve multiple masks, spacers, and mandrel layers.

The patterning process 109 may result in a nanostructure stack 112 in the first region 101 and fin structures 114 within the second region 103. The nanostructure stack may be an elongated element extending perpendicular to the view shown in FIGS. 1A-1J. Similarly, the fin structures 114 may be elongated elements extending perpendicular to the view shown in FIGS. 1A-1J.

Figure 1E:
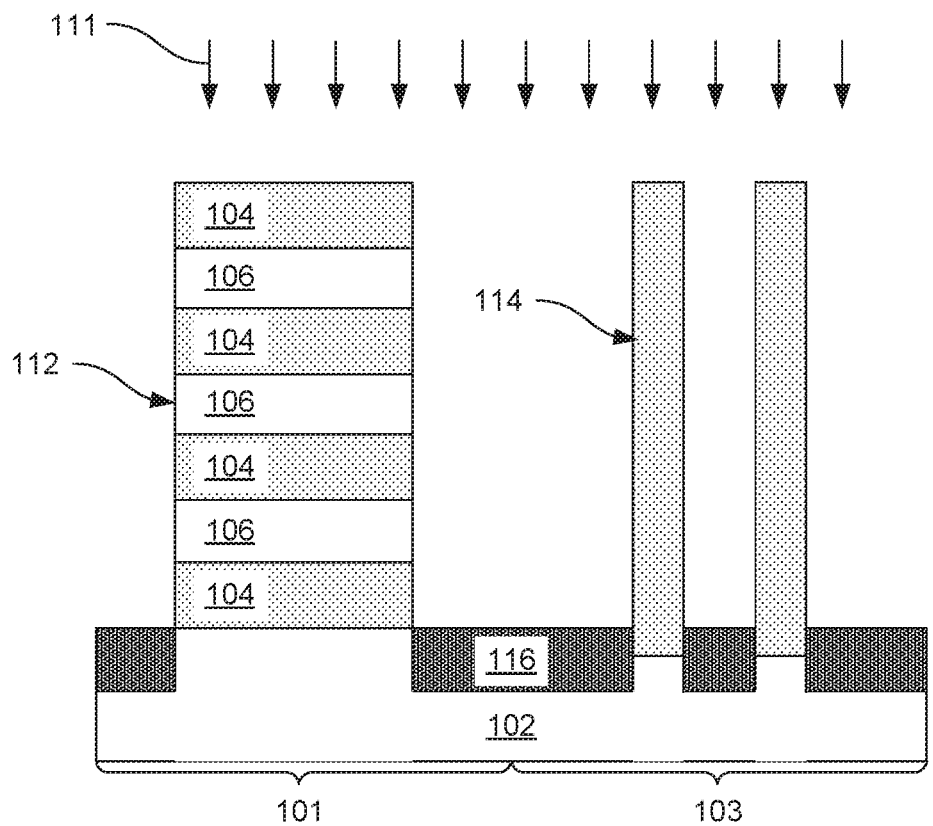

FIG. 1E illustrates the deposition of a shallow trench isolation STI structure 116. The STI structure is intended to electrically isolate different features from one another. Specifically, the fin structures 114 may be isolated from each other as well as from the nanostructure stack 112. The STI layer 116 may be a dielectric material such as silicon nitride or silicon dioxide. Various deposition techniques may be used to from the STI structure 116. The STI layer may be formed using a deposition process 111.

Figure 1F:
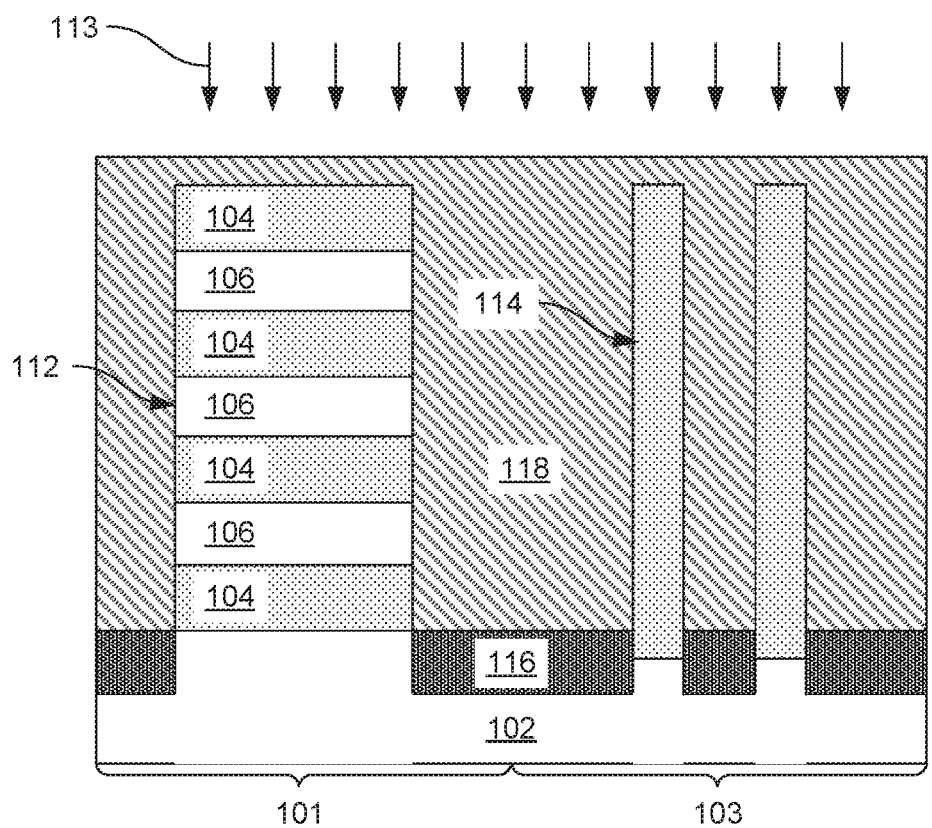

FIG. 1F illustrates the formation of a dummy gate 118. The dummy gate 118 may be a temporary structure that is later replaced with a real gate. The dummy gate 118 may be, for example, made of polysilicon. The dummy gate may be formed by depositing a layer of polysilicon (or other dummy gate material) onto the workpiece using a deposition process 113. Then, the layer of polysilicon may be patterned to form the dummy gate 118. After the dummy gate is formed, sidewall spacers may be formed along sidewalls of the dummy gate. After the sidewalls have been formed, source/drain regions may be formed within the nanostructure stack 112 and the fin structures 114. Because FIGS. 1A-1J illustrate a cross-section taken along the gate device, these figures show the channel and not the source/drain regions. A top view illustrating the source/drain regions is shown in FIG. 2 and will be described below.

In addition, an interlayer dielectric (ILD) layer may be deposited onto the workpiece to cover portions of the nanostructure stack 112 and the fin structures 114 that are not covered by the dummy gate 118. After the sidewalls and the source/drain regions have been formed, the dummy gate 118 is removed, thus exposing portions of the nanostructure stack 112 and the fin structures 114.

Figure 1G:
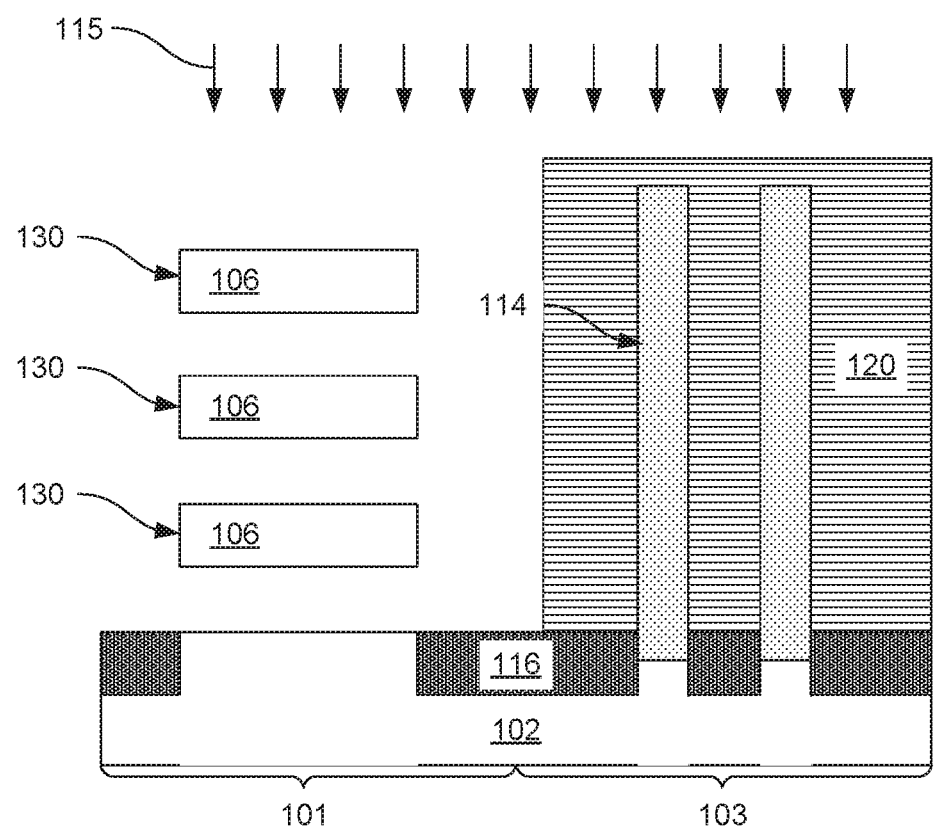
Figure 2:
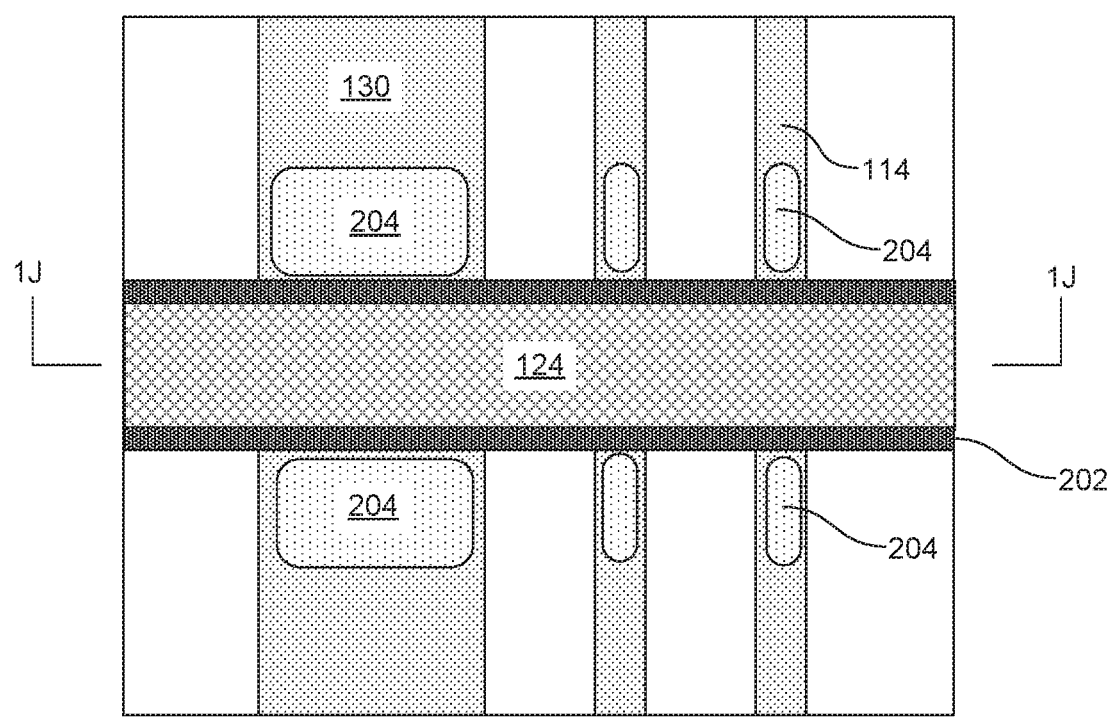
FIG. 2 is a diagram showing a top view of a hybrid nanostructure and fin structure device, according to one example of principles described herein.

FIG. 1G illustrates a removal process 115 to remove the second type of semiconductor material 104 from the nanostructure stack 112. The removal process 115 may be an isotropic etching process such as a wet etching process. Before the removal process 115 is applied, the fin structures 114 within the second region 103 may be covered. In one example, the fin structures 114 are covered with a photoresist material 120. The photoresist material may protect the fin structures 114 from the removal process 115. The removal process 115 may involve a selective etch that removes the second type semiconductor material 104 without substantially affecting the first type semiconductor material 106. The wet etching process may use an acid-based etchant such as: sulfuric acid (H2SO4), perchloric acid (HClO4), hydroiodic acid (HI), hydrobromic acid (HBr), nitric acid (HNO3), hydrochloric acid (HCl), acetic acid (CH3COOH), citric acid (C6H8O7), potassium periodate (KIO4), tartaric acid (C4H6O6), benzoic acid (C6H5COOH), tetrafluoroboric acid (HBF4), carbonic acid (H2CO3), hydrogen cyanide (HCN), nitrous acid (HNO2), hydrofluoric acid (HF), or phosphoric acid (H3PO4). In some examples, an alkaline-based etchant may be used. Such etchants may include but are not limited to ammonium hydroxide (NH4OH) and potassium hydroxide (KOH).

The remaining layers 106 within the nanostructure stack 112 may thus form nanostructures that can be used as channels in a transistor device. The nanostructure may be nanosheets or nanowires, depending on the shape. The nanostructures allow for a gate all around device to be formed.

Figure 1H:
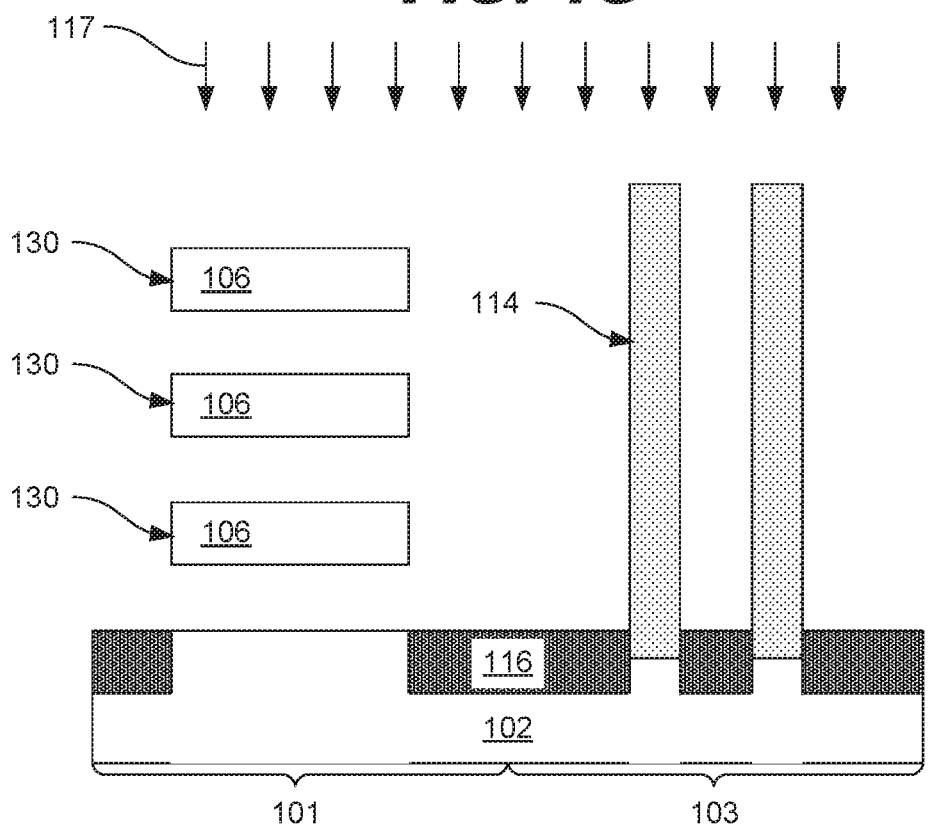

FIG. 1H illustrates a removal process 117 to remove the photoresist material 120 that was used to protect the fin structures 114. This is done after the second type layers 104 have been removed from the nanostructure stack 112. After this process, the nanostructures 106 within the first region 101 (i.e., NMOS region) are of a different semiconductor material than the fin structures in the second region (i.e., PMOS region). The different materials allow the NMOS and PMOS devices to be finely tuned to improve their electron or hole mobility.

For example, the semiconductor layers 106 that form the nanostructures may have a crystal orientation in the [100] direction. This orientation improves electron mobility and thus the efficiency of the NMOS transistor. The fin structures 114, however, may have sidewalls in the direction and a top surface in the [100] direction. This structure with the sidewalls having a different orientation improves hole mobility and thus the efficiency of the PMOS transistor. Thus by fabricating the transistors as described herein, both PMOS and NMOS transistors can be co-optimized as well as fabricated in the same CMOS process.

Figure 1I:
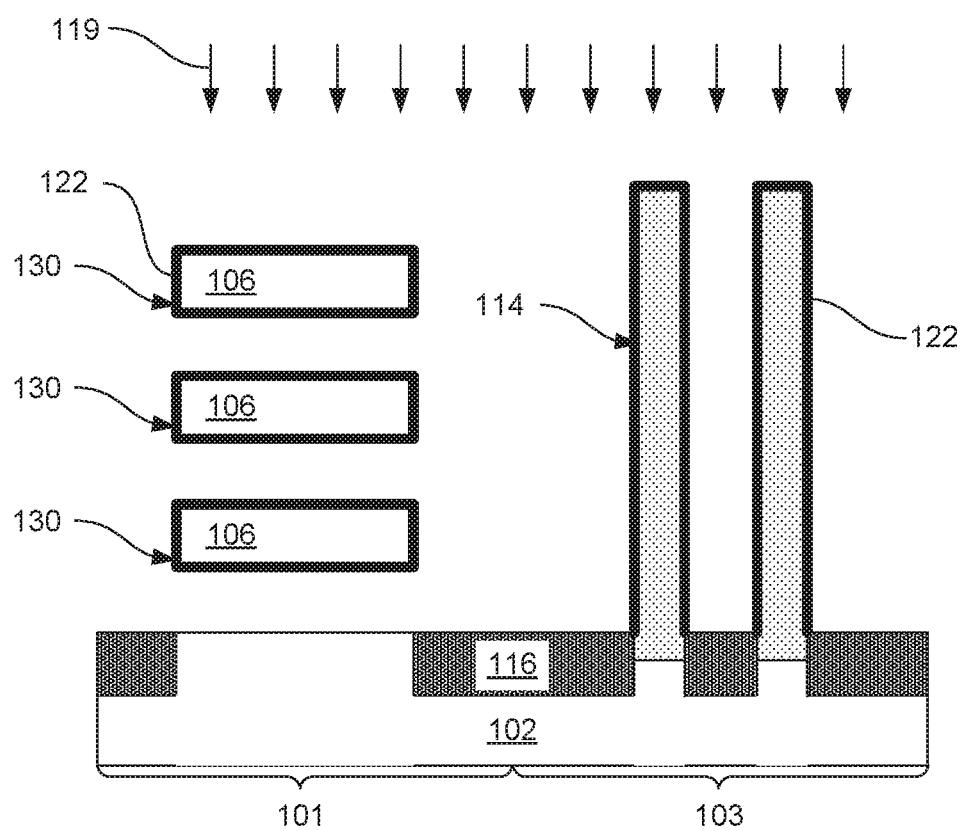

FIG. 1I illustrates a process 119 for forming a dielectric layer 122 around the nanostructures 130 and around the fin structures 114. In some examples, the dielectric layer 122 may include an interfacial layer and a high-k dielectric layer. The interfacial layer provides better adhesion of the high-k dielectric layer to the semiconductor material of the nanostructures 130 and fin structures 114. The high-k dielectric layer may include, for example, aluminum oxide, hafnium oxide, zirconium oxide, hafnium aluminum oxide, or hafnium silicon oxide. Other materials may be used as well. For example, other materials with a dielectric constant greater than 7 may be used.

In some examples, a p-type workfunction metal may be deposited over the fin structure 114. In such case, the nanostructures 130 may be temporarily covered with a photoresist. Then, a deposition process may be used to apply the p-type workfunction metal. Such metal is designed to give p-type metal gates the desired properties for ideal functionality. Various examples of a p-type workfunction metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), etc.

Additionally, an n-type work function metal may be formed around the nanostructures 130 on top of the dielectric layer 122. The n-type workfunction metal may include, but is not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC).

Figure 1J:
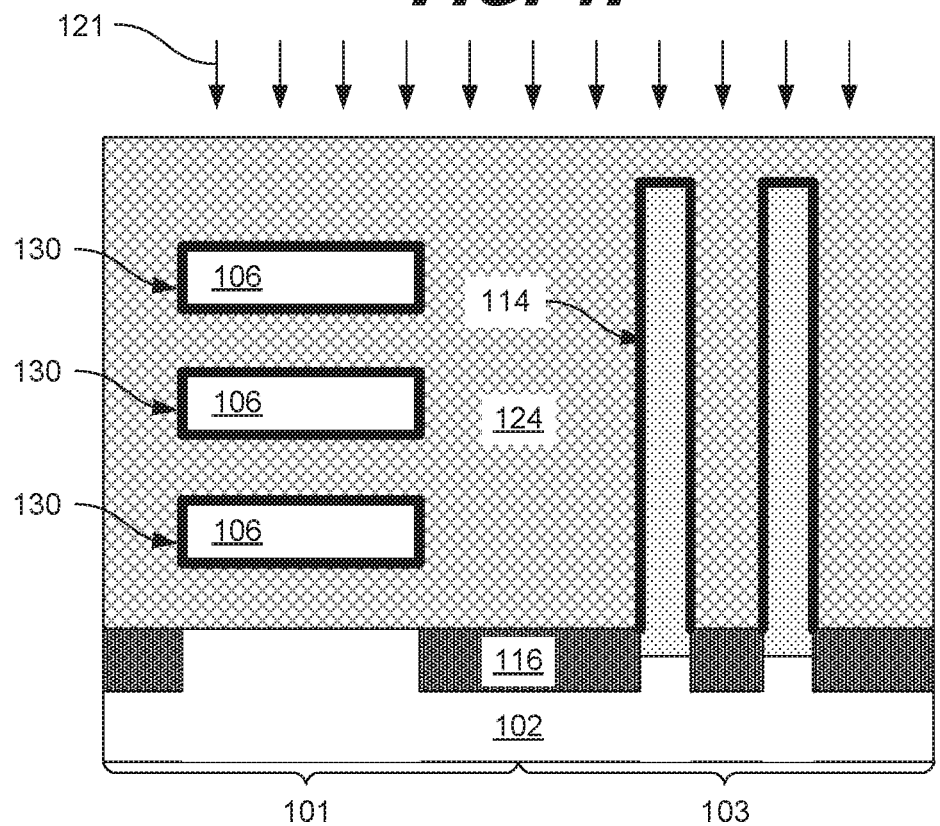

FIG. 1J illustrates a process 121 to form a replacement gate structure 124 within the space where the dummy gate 118 used to be. The replacement gate structure 124 may be a metal structure such as tungsten, copper, or cobalt. Other conductive materials are contemplated. Using the processes described herein, a n-type GAA transistor is formed in the first region 101 and a p-type finFET transistor is formed in the second region 103. Thus, a hybrid device in which the n-type transistor is a GAA device and the p-type transistor is a finFET device is realized.

FIG. 2 is a diagram showing a top view of a hybrid nanostructure and fin structure device. According to the present example, the top view shows the gate structures 124 extending longitudinally in a first direction. The fin structures 114 and the nanostructures 130 extend in a second direction that is perpendicular to the first direction. The gate structure 124 is formed between two sidewall structures 202. As described above, the sidewall structures 202 may be formed along sidewalls of a dummy gate, which is subsequently removed. The gate structure 124 is then formed within the space between the sidewall structures 202.

FIG. 2 also illustrates source/drain features 204 on both sides of the gate structure. The source/drain features 204 may be formed while the dummy gate 118 is still in place. The source/drain features may be formed by implanting dopant species into the semiconductor material. Specifically, a p-type dopant is implanted into the fin structures 114 and an n-type dopant is implanted into the nanostructures 130. It is noted that for purposes of illustration, FIG. 2 does not illustrate an ILD layer so as to show the nanostructures 130, fin structures 114, and source/drain features 204.

Figure 3:
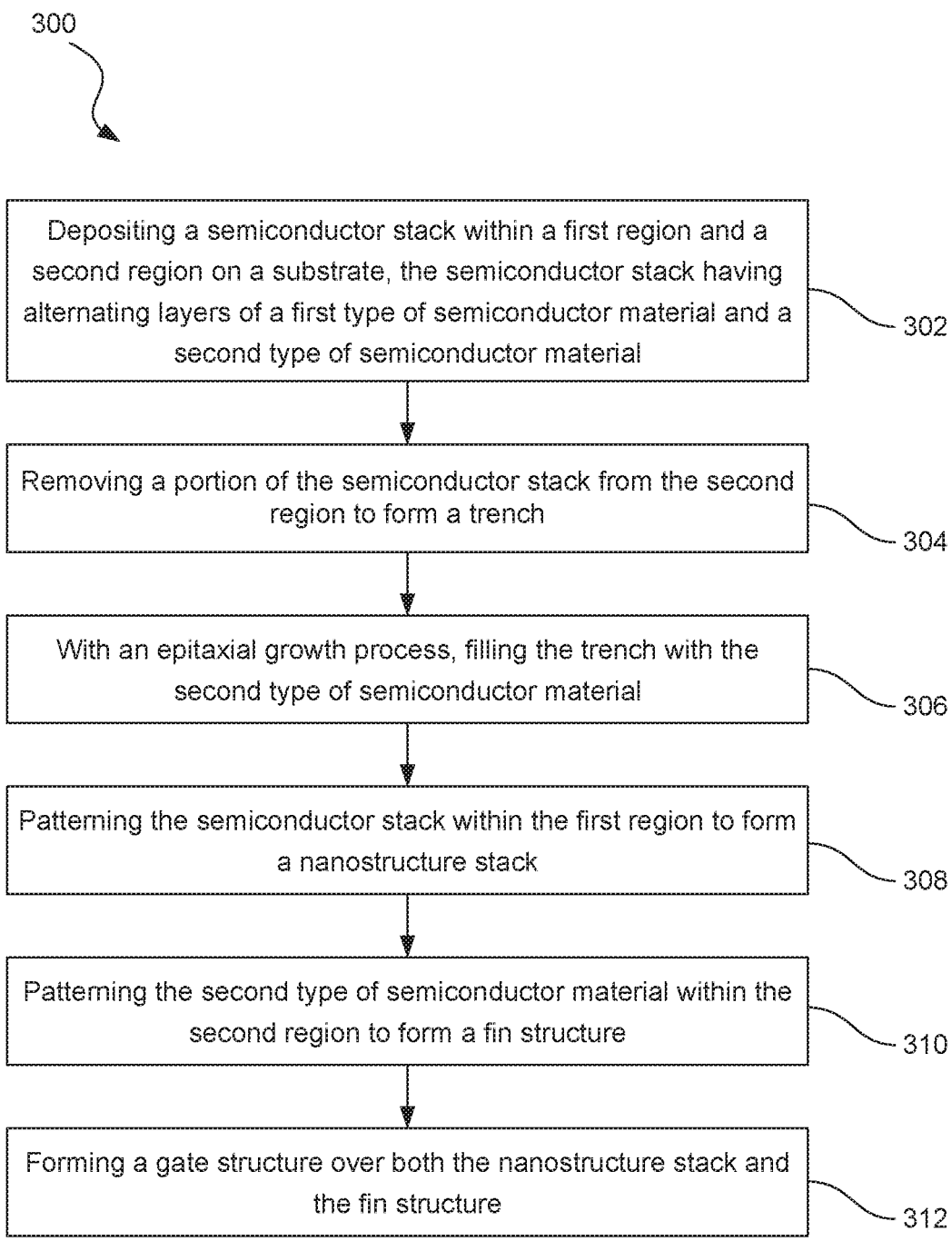
FIG. 3 is a flowchart showing an illustrative method for forming a hybrid nanostructure and fin structure device, according to one example of principles described herein.

FIG. 3 is a flowchart showing an illustrative method 300 for forming a hybrid nanostructure and fin structure device. According to the present example, the method 300 includes a process 302 for depositing a semiconductor stack (e.g., 150) within a first region and a second region on a substrate, the semiconductor stack having alternating layers of a first type of semiconductor material and a second type of semiconductor material. In one example, the first region (e.g., 101) is an n-type region. An n-type region is a region in which an n-type semiconductor structure is to be formed. In one example, the second region (e.g., 103) is a p-type region. A p-type region is one in which a p-type structure is to be formed. The semiconductor stack includes several semiconductor layers that alternate between a first type layer made of a first type semiconductor material and a second type layer made of a second type semiconductor material. In one example, the first type of semiconductor material is silicon and the second type of semiconductor material is silicon germanium. Other semiconductor materials are contemplated. The first type layers and the second type layers may be formed using a variety of processes, including epitaxial growth processes. Other processes are contemplated.

According to the present example, the method 300 further includes a process 304 for removing a portion of the semiconductor stack from the second region to form a trench (e.g., 108). The portion that is removed is within the second region. The trench extends all the way through the semiconductor stack and partially into the substrate. The process used to form the trench may be, for example, an etching process. In one example, the etching process is a dry etching process. In some examples, photolithographic process is used to form the trench. Specifically, a photoresist material may be deposited onto the semiconductor stack. Then, the photoresist may be exposed to a light source through a photomask. The photomask may then be developed so as to expose the region where the trench it is to be formed. The unexposed regions may then be protected from the etching process.

According to the present example, the method 300 further includes a process 306 for, with an epitaxial growth process, filling the trench with the second type of semiconductor material. The semiconductor material may be the same as the semiconductor material used to form the second type layers 104. For example, the semiconductor material 110 may be silicon germanium. In some examples, the semiconductor material may be placed under biaxial stress due to the crystallographic differences between the semiconductor layer and the underlying substrate.

According to the present example, the method 300 further includes a process 308 for patterning the semiconductor stack within the first region to form a nanostructure stack. The patterning process may involve one or more anisotropic etching processes such as dry etching processes. In some examples, the nanostructure stack within the first region may be patterned directly. In some examples, the second type of semiconductor material (e.g., 104) may be removed from the nanostructure stack to leave nanostructures (e.g., 130) remaining.

According to the present example, the method 300 further includes a process 310 for patterning the second type of semiconductor material within the second region to form a fin structure. The patterning process may involve one or more anisotropic etching processes such as dry etching processes. In some examples, the second region may be patterned using double patterning techniques that involve multiple masks, spacers, and mandrel layers.

According to the present example, the method 300 includes a process 312 for forming a gate structure over both the nanostructure stack and the fin structure. In some examples, forming the gate structure involves forming a number of sub-layers, including an interfacial layer, a high-k dielectric layer, and workfunction layers. For example, the interfacial layer may be used to provided better adhesion of the high-k dielectric layer to the semiconductor material of the nanostructures and fin structures. The high-k dielectric layer may include, for example, aluminum oxide, hafnium oxide, zirconium oxide, hafnium aluminum oxide, or hafnium silicon oxide. Other materials may be used as well. For example, other materials with a dielectric constant greater than 7 may be used. In some examples, a p-type workfunction metal may be deposited over the fin structures. In such case, the nanostructures may be temporarily covered with a photoresist. Then, a deposition process may be used to apply the p-type workfunction metal. Such metal is designed to give p-type metal gates the desired properties for ideal functionality. Various examples of a p-type workfunction metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), etc. Additionally, an n-type work function metal may be formed around the nanostructures on top of the dielectric layer. The n-type workfunction metal may include, but is not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC).

Figure 4:
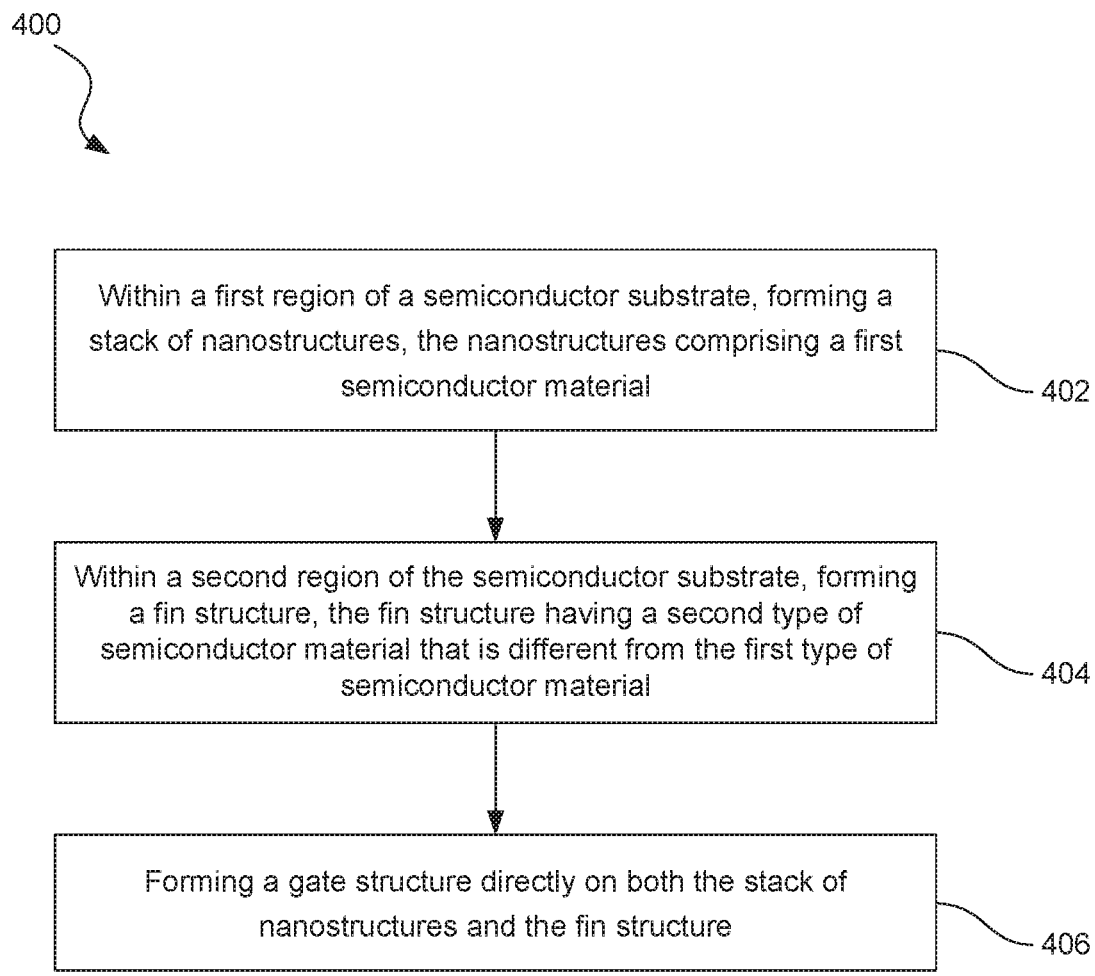
FIG. 4 is a flowchart showing an illustrative method for forming a hybrid nanostructure and fin structure device, according to one example of principles described herein.

FIG. 4 is a flowchart showing an illustrative method for forming a hybrid nanostructure and fin structure device. According to the present example, the method 400 includes a process 402 for, within a first region of a semiconductor substrate, forming a stack of nanostructures, the nanostructures comprising a first semiconductor material. The nanostructure stack may be formed by depositing alternating layers of different types of semiconductor material. In other words, a semiconductor stack is formed by depositing alternating layers of material that may be selectively etched. For example, a first type of semiconductor material may be epitaxially grown. Then, a second type of semiconductor material may be epitaxially grown. The process continues by forming alternating layers of the first and second semiconductor material. Then, a first etching process (e.g., a dry etching process) is used to pattern the semiconductor stack and create nanostructure stacks. Then, a second etching process (e.g., a wet etching process) can be used to remove the first semiconductor material while leaving the second semiconductor material substantially intact. The remaining second semiconductor material may thus form a stack of nanowires or nanosheets.

The method 400 further includes a process 404 for, within a second region of the semiconductor substrate, forming a fin structure, the fin structure having a second type of semiconductor material that is different from the first type of semiconductor material. In some examples, forming the fin structure may be done during the same complementary metal oxide semiconductor (CMOS) process as the nanostructure stack. For example, when the semiconductor stack is formed and before it is patterned, a trench (e.g., 108) may be formed within the semiconductor stack. The trench may extend all the way through the semiconductor stack and partially into the substrate. The process used to form the trench may be, for example, an etching process. In one example, the etching process is a dry etching process. In some examples, photolithographic process is used to form the trench. Specifically, a photoresist material may be deposited onto the semiconductor stack. Then, the photoresist may be exposed to a light source through a photomask. The photomask may then be developed so as to expose the region where the trench it is to be formed. The unexposed regions may then be protected from the etching process. Then, with an epitaxial growth process, the trench 108 may be filled with a semiconductor material that matches the first type of semiconductor material, which in one example may be silicon germanium. When the semiconductor stack is patterned to form a nanostructure stack, the filled trench may also be patterned to form fin structures. This may be done in either the same patterning process or a different patterning process.

The method 400 further includes a process 406 for forming a gate structure directly on both the stack of nano structures and the fin structure. This forms a hybrid device in which the NMOS transistor comprises a GAA device and the PMOS transistor comprises a finFET device. In some examples, forming the gate structure involves forming a number of sub-layers, including an interfacial layer, a high-k dielectric layer, and workfunction layers. For example, the interfacial layer may be used to provided better adhesion of the high-k dielectric layer to the semiconductor material of the nanostructures and fin structures. The high-k dielectric layer may include, for example, aluminum oxide, hafnium oxide, zirconium oxide, hafnium aluminum oxide, or hafnium silicon oxide. Other materials may be used as well. For example, other materials with a dielectric constant greater than 7 may be used. In some examples, a p-type workfunction metal may be deposited over the fin structures. In such case, the nanostructures may be temporarily covered with a photoresist. Then, a deposition process may be used to apply the p-type workfunction metal. Such metal is designed to give p-type metal gates the desired properties for ideal functionality. Various examples of a p-type workfunction metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), etc. Additionally, an n-type work function metal may be formed around the nanostructures on top of the dielectric layer. The n-type workfunction metal may include, but is not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC).

According to one example, a method includes depositing a semiconductor stack within a first region and a second region on a substrate, the semiconductor stack having alternating layers of a first type of semiconductor material and a second type of semiconductor material. The method further includes removing a portion of the semiconductor stack from the second region to form a trench and with an epitaxial growth process, filling the trench with the second type of semiconductor material. The method further includes patterning the semiconductor stack within the first region to form a nanostructure stack, patterning the second type of semiconductor material within the second region to form a fin structure, and forming a gate structure over both the nanostructure stack and the fin structure.

According to one example, a method includes, within a first region of a semiconductor substrate, forming a stack of nanostructures, the nanostructures comprising a first semiconductor material. The method further includes, within a second region of the semiconductor substrate, forming a fin structure, the fin structure having a second type of semiconductor material that is different from the first type of semiconductor material. The method further includes forming a gate structure directly on both the stack of nanostructures and the fin structure.

A semiconductor device includes a first structure having a stack of nanostructures, each of the nanostructures comprising a channel region, each of the nanostructures comprising a first type of semiconductor material. The first structure includes a first interfacial layer surrounding each of the nanostructures, a first dielectric layer surrounding the interfacial layer, a second structure adjacent the first structure. The second structure includes a fin structure comprising a channel region, the fin structure comprising a second type of semiconductor material that is different than the first type of semiconductor material, a second interfacial layer surrounding the fin structure, and a second dielectric layer surrounding the interfacial layer. The device further includes a gate structure extending over both the first structure and the second structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a semiconductor stack within a first region and a second region on a substrate, the substrate having a first crystalline orientation, the semiconductor stack having alternating layers of a first type of semiconductor material and a second type of semiconductor material;
   removing a portion of the semiconductor stack from the second region to form a trench;
   with an epitaxial growth process, filling the trench with the second type of semiconductor material such that the second type of semiconductor material physically contacts the substrate and sidewalls of the semiconductor stack, the second type of semiconductor material having a second crystalline orientation that is different than the first crystalline orientation;
   patterning the semiconductor stack within the first region to form a nanostructure stack;
   patterning the second type of semiconductor material within the second region to form a fin structure;
   forming a first gate structure over both the nanostructure stack and the fin structure, wherein the first gate structure includes a first conductive material layer;
   removing the first conductive material layer from over both the nanostructure stack and the fin structure;
   after removing the first conductive material layer, removing the second type of semiconductor material from the nanostructure stack; and
   after removing the second type of semiconductor material from the nanostructure stack, forming a second gate structure around each layer of the first type of semiconductor material from the nanostructure stack and on the fin structure, wherein the second gate structure includes a second conductive material layer disposed around each layer of the first type of semiconductor material from the nanostructure stack and on the fin structure.

2. The method of claim 1, wherein the forming of the second gate structure around each layer of the first type of semiconductor material from the nanostructure stack and on the fin structure includes forming an interfacial layer around each layer of the first type of semiconductor material from the nanostructure stack and on the fin structure.

3. The method of claim 2, wherein the forming of the second gate structure around each layer of the first type of semiconductor material from the nanostructure stack and on the fin structure further includes forming a dielectric layer on the interfacial layer disposed around each layer of the first type of semiconductor material from the nanostructure stack and on the fin structure.

4. The method of claim 1, wherein the first type of semiconductor material comprises silicon.

5. The method of claim 4, wherein the substrate comprises silicon.

6. The method of claim 1, wherein the second type of semiconductor material comprises silicon germanium.

7. The method of claim 1, wherein sidewalls of the fin structure have a [110] crystal orientation.

8. The method of claim 1, wherein top surfaces of nanostructures of the nanostructure stack have a [100] crystal orientation.

9. The method of claim 1, wherein the first region comprises an n-type metal oxide semiconductor (NMOS) region and the second region comprises a p-type metal oxide semiconductor (PMOS) region.

10. The method of claim 1, wherein the second type of semiconductor material comprises germanium.

11. The method of claim 1, wherein the first region is an NMOS region and the second region is a PMOS region.

12. The method of claim 1, further comprising forming a first source/drain feature on the fin structure after forming the first gate structure over both the nanostructure stack and the fin structure, and
wherein the forming of the first source/drain feature on the fin structure occurs prior to removing the first conductive material layer from over both the nanostructure stack and the fin structure.

13. A method comprising:
within a first region of a semiconductor substrate, forming a stack of nanostructures, the nanostructures comprising alternating layers of a first type of semiconductor material and a second type of semiconductor material;
within a second region of the semiconductor substrate, the semiconductor substrate having a first crystalline orientation, forming a fin structure directly on and physically contacting the semiconductor substrate, the fin structure having the second type of semiconductor material that is different from the first type of semiconductor material, and the fin structure having a second crystalline orientation that is different than the first crystalline orientation;
forming a first gate structure directly on both the stack of nanostructures and the fin structure, wherein the first gate structure includes a first conductive material layer;
removing the first conductive material layer from over both the stack of nanostructures and the fin structure;
after removing the first conductive material layer, removing the second type of semiconductor material from the stack of nanostructures; and
after removing the second type of semiconductor material from the stack of nanostructures, forming a second gate structure around each layer of the first type of semiconductor material from the stack of nanostructures and on the fin structure, wherein the second gate structure includes a second conductive material layer disposed around each layer of the first type of semiconductor material from the stack of nanostructures and on the fin structure, and
wherein the fin structure physically contacts a first portion of the semiconductor substrate after the forming of the second gate structure around each layer of the first type of semiconductor material from the stack of nanostructures and on the fin structure, the first portion of the semiconductor substrate extending to a first height, and
wherein a second portion of the semiconductor is disposed directly under the stack of nanostructures after the forming of the second gate structure around each layer of the first type of semiconductor material from the stack of nanostructures and on the fin structure, the second portion of the semiconductor substrate extending to a second height that is greater than the first height.

14. The method of claim 13, wherein the first type of semiconductor material comprises silicon and the second type of semiconductor material comprises silicon germanium.

15. The method of claim 13, wherein a crystal orientation of the first type of semiconductor material is [100] on a top and bottom surface and a crystal orientation of sidewalls of the fin structure is [110].

16. A semiconductor device comprising:
a first structure having:
a stack of nanostructures, each of the nanostructures comprising a channel region, each of the nanostructures comprising a first type of semiconductor material, wherein a crystal orientation of the first type of semiconductor material is [100] on a top and bottom surface;
a first interfacial layer surrounding each of the nanostructures; and
a first dielectric layer surrounding the first interfacial layer;
a second structure adjacent the first structure, the second structure comprising:
a fin structure extending vertically from and physically contacting a substrate, the fin structure comprising a channel region, the fin structure comprising a second type of semiconductor material that is different than the first type of semiconductor material, the substrate having a first crystalline orientation, and the fin structure having a second crystalline structure that is different than the first crystalline orientation, wherein a crystal orientation of sidewalls of the fin structure is [110] and a crystal orientation of a top surface of the fin structure is [100];
a second interfacial layer surrounding the fin structure; and
a second dielectric layer surrounding the interfacial layer; and
a gate structure extending over both the first structure and the second structure,
wherein the substrate is a semiconductor substrate,
wherein the first structure and the second structure are disposed over the semiconductor substrate,
wherein the fin structure physically contacts a first portion of the semiconductor substrate, the first portion of the semiconductor substrate extending to a first height, and
wherein a second portion of the semiconductor is disposed directly under the stack of nanostructures, the second portion of the semiconductor substrate extending to a second height that is greater than the first height.

17. The device of claim 16, wherein the second type of semiconductor material comprises at least one of: SiGe, Ge, GaAs, or InP.

18. The device of claim 16, further comprising a shallow trench isolation structure extending from the first portion of the semiconductor substrate to the second portion of the semiconductor substrate, and wherein the shallow trench isolation structure physically contacts the fin structure, the first portion of the semiconductor substrate and the second portion of the semiconductor substrate.

19. The device of claim 18, wherein the shallow trench isolation structure is separate from each of the nanostructures from the stack of nanostructures such that the shallow trench isolation structure does not physically contact any nanostructure from the stack of nanostructures.

20. The device of claim 16, further comprising a shallow trench isolation structure physically contacting the second portion of the semiconductor substrate, the shallow trench isolation structure extending to the second height.

* * * * *